(12) United States Patent
Kim et al.

(10) Patent No.: US 12,185,582 B2
(45) Date of Patent: Dec. 31, 2024

(54) ELECTROLUMINESCENCE DISPLAY DEVICE HAVING BOTTOM SHIELDING METAL AND CAPACITOR ELECTRODE

(71) Applicant: LG Display Co., Ltd., Seoul (KR)

(72) Inventors: Seong-Yeong Kim, Paju-si (KR);
Soon-Hwan Hong, Paju-si (KR);
Kyung-Ah Chin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 332 days.

(21) Appl. No.: 17/556,986

(22) Filed: Dec. 20, 2021

(65) Prior Publication Data

US 2022/0208917 A1    Jun. 30, 2022

(30) Foreign Application Priority Data

Dec. 29, 2020  (KR) ........................ 10-2020-0186090

(51) Int. Cl.
*H01L 29/08* (2006.01)
*H10K 59/121* (2023.01)
*H10K 59/122* (2023.01)

(52) U.S. Cl.
CPC ..... *H10K 59/1213* (2023.02); *H10K 59/1216* (2023.02); *H10K 59/122* (2023.02)

(58) Field of Classification Search
CPC ............. H10K 59/1213; H10K 59/122; H10K 59/1216

USPC ........................................................... 257/40
See application file for complete search history.

(56) References Cited

U.S. PATENT DOCUMENTS

| | | | |
|---|---|---|---|
| 9,564,480 B2 | 2/2017 | Jang | |
| 9,755,011 B2 | 9/2017 | Jang | |
| 10,651,258 B2 * | 5/2020 | Beak | H10K 59/131 |
| 2015/0188083 A1 | 7/2015 | Jang | |
| 2017/0104053 A1 | 4/2017 | Jang | |
| 2020/0091273 A1 * | 3/2020 | Lee | H10K 59/10 |
| 2020/0203468 A1 * | 6/2020 | Zeng | H10K 59/65 |

FOREIGN PATENT DOCUMENTS

| | | | | |
|---|---|---|---|---|
| CN | 109728033 A | * | 5/2019 | .......... H01L 27/3211 |
| CN | 111710707 A | * | 9/2020 | .......... G09G 3/3225 |
| KR | 10-2015-0078389 A | | 7/2015 | |
| KR | 10-2016-0068635 A | | 6/2016 | |
| KR | 20180078813 A | * | 7/2018 | .......... H10K 59/131 |

* cited by examiner

*Primary Examiner* — Phuc T Dang
(74) *Attorney, Agent, or Firm* — Fenwick & West LLP

(57) ABSTRACT

A display device includes: a substrate having a subpixel and a circuit line area adjacent to the subpixel; a driving transistor in the subpixel; a first bottom shielding metal portion under the driving transistor in the subpixel and a second bottom shielding metal portion in the circuit line area; a first capacitor electrode portion in the subpixel and a second capacitor electrode portion in the circuit line area; and a light emitting diode in the subpixel, wherein the second bottom shielding metal portion is electrically connected to the second capacitor electrode portion in the circuit line area.

20 Claims, 10 Drawing Sheets

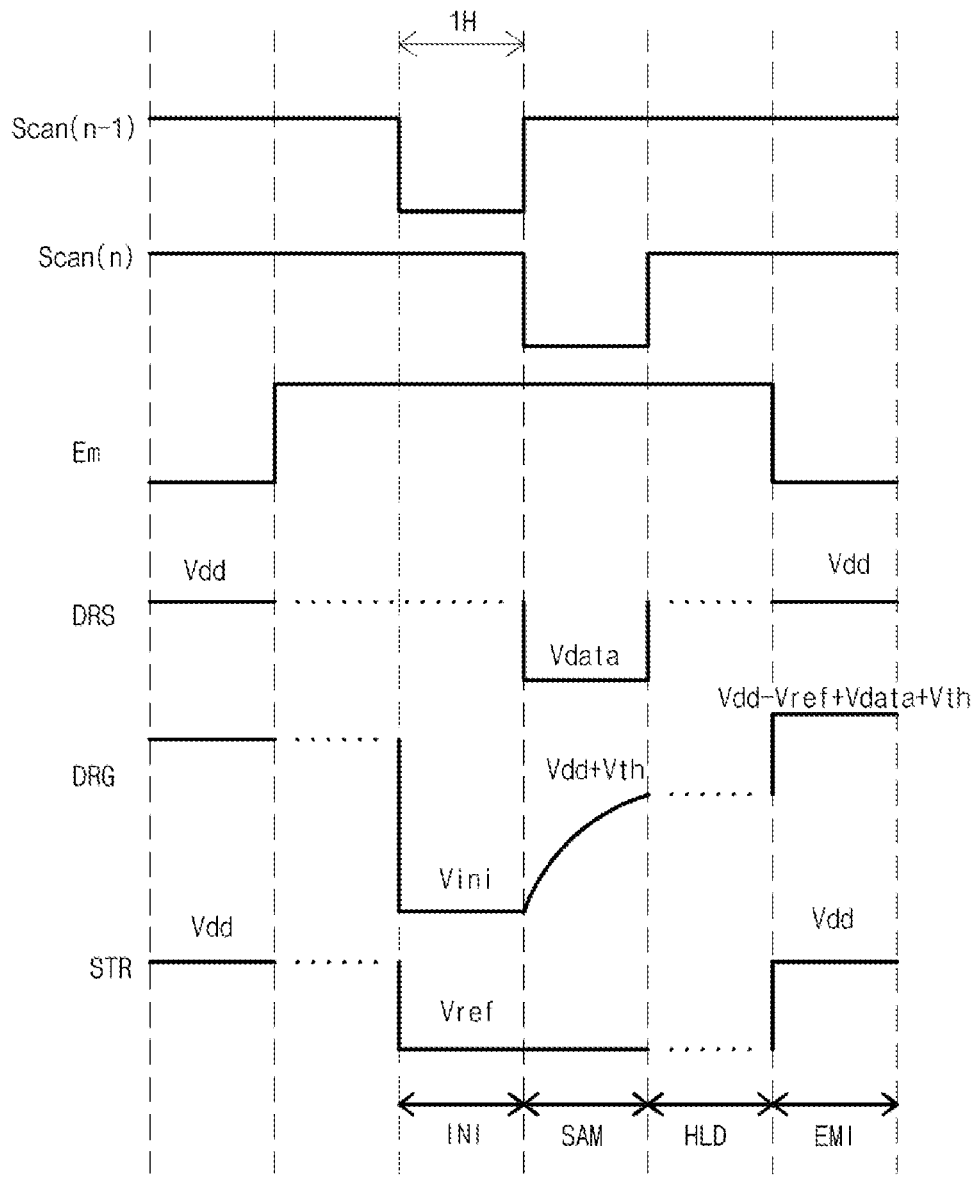

ELECTROLUMINESCENCE DISPLAY DEVICE HAVING BOTTOM SHIELDING METAL AND CAPACITOR ELECTRODE

CROSS REFERENCE TO RELATED APPLICATIONS

The present application claims the priority benefit of Republic of Korea Patent Application No. 10-2020-0186090 filed in the Republic of Korea on Dec. 29, 2020, which is hereby incorporated by reference herein in its entirety.

BACKGROUND

Technical Field

The present disclosure relates to an electroluminescence display device, and more particularly, to an electroluminescence display device where an aperture ratio is improved.

Discussion of the Related Art

As application range of a display device which is a connection medium between a user and an information has been enlarged, various display devices such as an electroluminescence display device have been used for an electronic equipment such as a portable phone and a notebook computer.

Since the electroluminescence display device displays an image based on light generated from an emissive element (a light emitting diode) in a subpixel, an additional light source is not required. As a result, the electroluminescence display device has advantages such as a thin profile. The emissive element may be formed of an organic material or an inorganic material.

When a gate signal and a data signal are supplied to the subpixels of the electroluminescence display device, the emissive elements of the subpixels emits light to display an image. The electroluminescence display device includes a driving circuit driving the subpixels and a power circuit supplying a power to the subpixels. The driving circuit includes a gate driving circuit supplying a gate signal (a gate voltage) and a data driving circuit supplying a data signal (a data voltage).

The driving circuit may have a deterioration compensation function as well as a driving function. As a result, the driving circuit becomes complicated and has a side effect. For example, since the subpixel includes a plurality of lines and a plurality of thin film transistors, an area for the plurality of lines and the plurality of thin film transistors increases, and an area for an emission region of the electroluminescence display device decreases.

SUMMARY

Accordingly, the present disclosure is directed to an electroluminescence display device that substantially obviates one or more of the problems due to limitations and disadvantages of the related art.

An object of the present disclosure is to provide an electroluminescence display device where an emission region of a subpixel is enlarged by connecting a bottom shielding metal to a capacitor electrode in a circuit line area other than a subpixel.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a substrate having a subpixel and a circuit line area adjacent to the subpixel; a driving transistor in the subpixel; a first bottom shielding metal portion under the driving transistor in the subpixel and a second bottom shielding metal portion in the circuit line area; a first capacitor electrode portion in the subpixel and a second capacitor electrode portion in the circuit line area; and a light emitting diode in the subpixel, wherein the second bottom shielding metal portion is electrically connected to the second capacitor electrode portion in the circuit line area.

In another aspect, a display device includes: a subpixel and a circuit line area adjacent to the subpixel; a driving transistor in the subpixel; a bottom shielding metal in the subpixel and the circuit line area; and a capacitor electrode in the subpixel and the circuit line area, wherein the bottom shielding metal is electrically connected to the capacitor electrode in the circuit line area.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 4 is a timing chart showing a plurality of signals of an electroluminescence display device according to an embodiment of the present disclosure;

DETAILED DESCRIPTION

Figure 1:
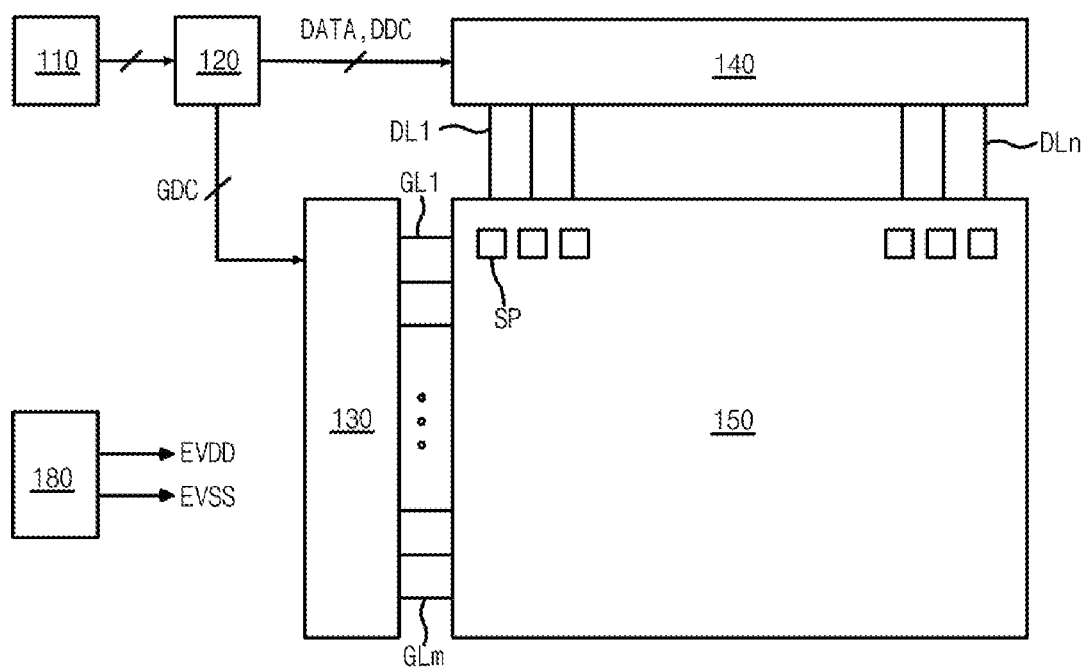
FIG. 1 is a view showing an electroluminescence display device according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a display device according to embodiments of the present disclosure will be described in detail with reference to the accompanying drawings, taking an electroluminescence display device as an example. In the following description, same reference numerals designate same elements throughout. When a detailed description of well-known functions or configurations related to this document is determined to unnecessarily cloud a gist of the inventive concept, the detailed description thereof will be omitted or will be made brief.

Figure 2:
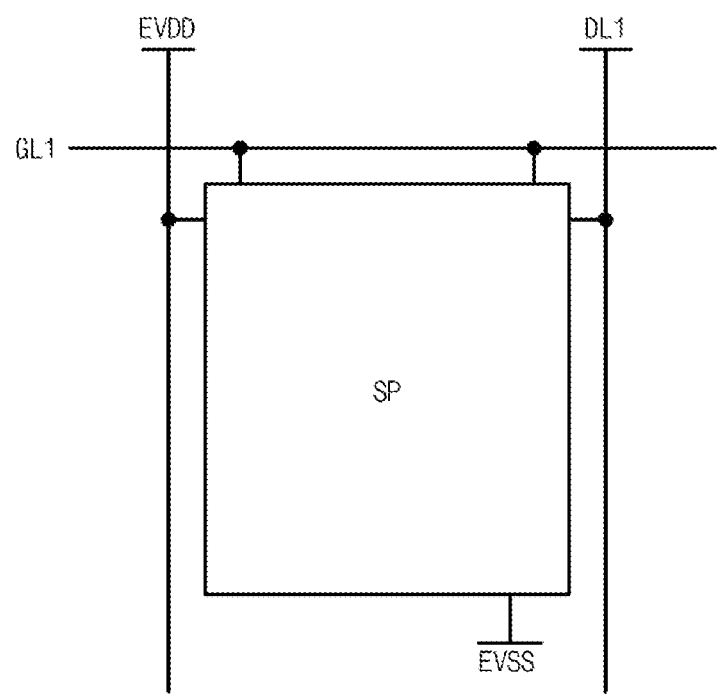
FIG. 2 is a view showing a subpixel of an electroluminescence display device according to an embodiment of the present disclosure.

FIG. 1 is a view showing an electroluminescence display device according to an embodiment of the present disclosure, and FIG. 2 is a view showing a subpixel of an electroluminescence display device according to an embodiment of the present disclosure.

In FIG. 1, an electroluminescence display device includes an image processing part 110, a timing controlling part 120, a gate driving part 130, a data driving part 140, a power supplying part 180 and a display panel 150.

The image processing part 110 outputs a plurality of timing signals for various parts as well as an image signal supplied from an exterior. For example, the plurality of timing signals may include a data enable signal, a vertical synchronization signal, a horizontal synchronization signal and a clock signal.

The timing controlling part 120 receives the image signal and the plurality of timing signals from the image processing part 110. The timing controlling part 120 generates an image data DATA, a gate control signal GDC and a data control signal DDC using the image signal and the plurality of timing signals. The timing controlling part 120 transmits the gate control signal GDC to the gate driving part 130 and transmits the image data and the data control signal DDC to the data driving part 140.

The gate driving part 130 generates a gate signal (a gate voltage) using the gate control signal GDC transmitted from the timing controlling part 120 and applies the gate signal to a plurality of gate lines GL1 to GLm of the display panel 150. Although the gate driving part 130 may be formed as an integrated circuit (IC), it is not limited thereto.

The gate driving part 130 may have a gate-in-panel (GIP) type where the gate driving part 130 is disposed on a substrate of the display panel 150.

The data driving part 140 generates a data signal (a data voltage) using the data control signal DDC and the image data DATA transmitted from the timing controlling part 120 and applies the data signal to a plurality of data lines DL1 to DLn of the display panel 150. The data driving part 140 samples and latches the image data DATA of a digital type to output the data signal of an analog type based on a gamma reference voltage. Although the data driving part 140 may be formed as an integrated circuit (IC), it is not limited thereto.

The power supplying part 180 outputs a high level voltage Vdd and a low level voltage Vss. The power supplying part 180 supplies the high level voltage Vdd to the display panel 150 through a first power line EVDD and supplies the low level voltage Vss to the display panel 150 through a second power line EVSS. In addition, the high level voltage Vdd and the low level voltage Vss of the power supplying part 180 may be supplied to the gate driving part 130 or the data driving part 140 for driving.

The display panel 150 displays an image using the gate signal of the gate driving part 130, the data signal of the data driving part 140 and the high level voltage Vdd and the low level voltage Vss of the power supplying part 180.

The display panel 150 includes a plurality of subpixels SP, a plurality of gate lines GL1 to GLm and a plurality of data lines DL1 to DLn. The plurality of subpixels SP may include red, green and blue subpixels SP or white, red, green and blue subpixels SP. The white, red, green and blue subpixels SP may have the same area as each other or may have a different area from each other.

In FIG. 2, a single subpixel SP may be connected to the gate line GL1, the data line DL1, the first power line EVDD and the second power line EVSS. A driving method as well as the number of transistors and capacitors of the subpixel SP may be determined according to a structure of a subpixel circuit.

Figure 3A:
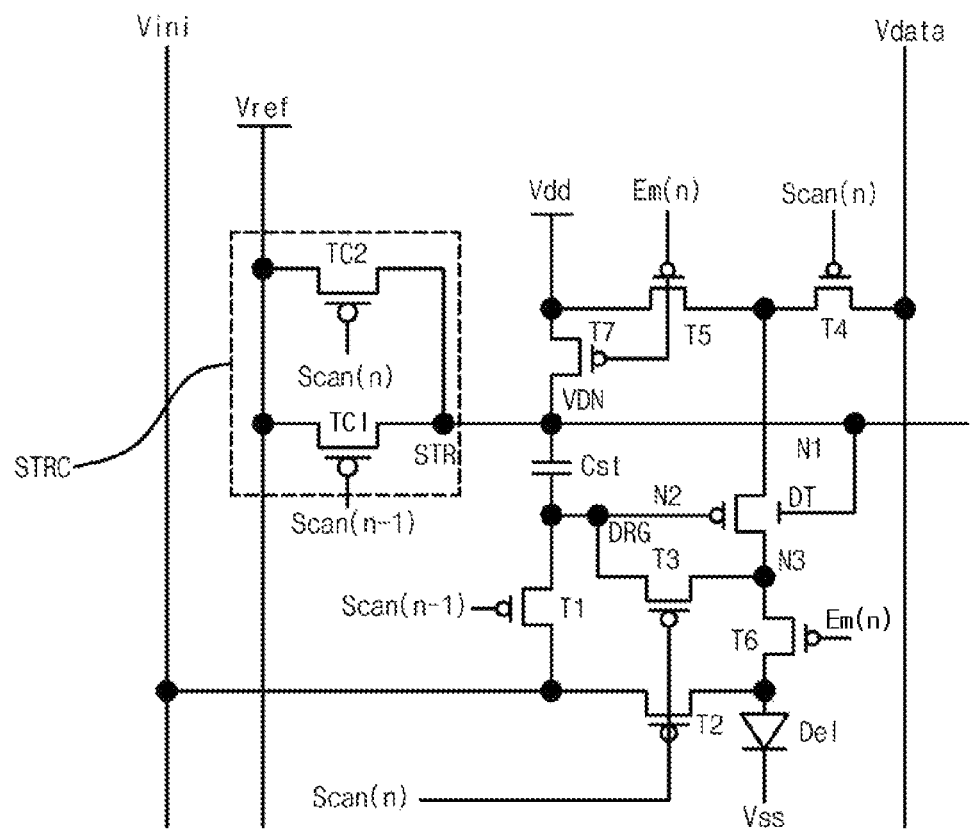
FIG. 3A is a view showing a circuit of a subpixel of an electroluminescence display device according to an embodiment of the present disclosure.
Figure 3B:
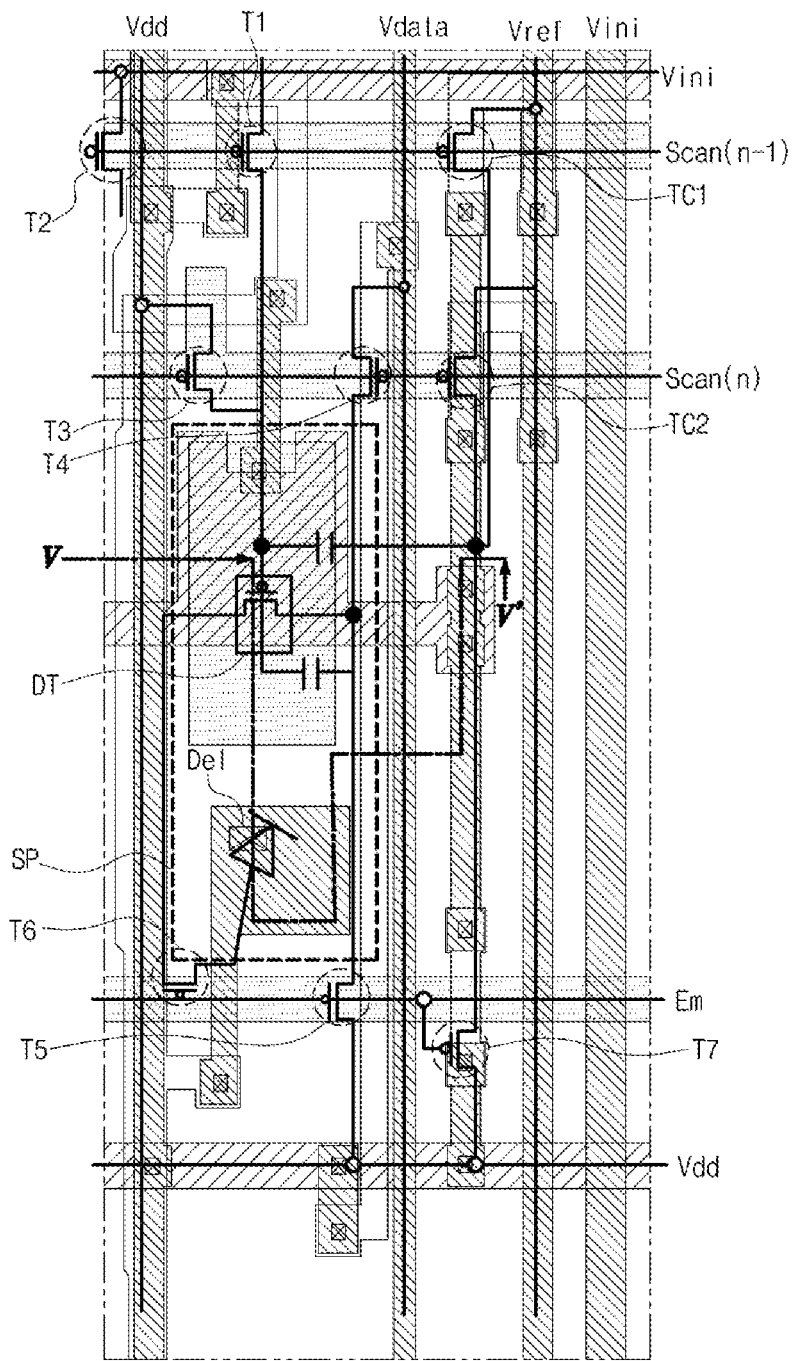
FIG. 3B is a plan view showing a subpixel of an electroluminescence display device according to an embodiment of the present disclosure.

FIG. 3A is a view showing a circuit of a subpixel of an electroluminescence display device according to an embodiment of the present disclosure, FIG. 3B is a plan view showing a subpixel of an electroluminescence display device according to an embodiment of the present disclosure, and FIG. 4 is a timing chart showing a plurality of signals of an electroluminescence display device according to an embodiment of the present disclosure.

In FIGS. 3A and 3B, a subpixel SP may include a plurality of switching transistors T1 to T7, a driving transistor DT, a storage capacitor Cst and a light emitting diode Del. Although the subpixel SP includes eight transistors in FIGS. 3A and 3B, it is not limited thereto. In addition, the subpixel SP may include a reference voltage compensating part STRC having first and second compensating transistors TC1 and TC2.

A first node N1 is a connection node of the driving transistor DT and a bottom shielding metal, and a second node N2 is a connection node of a gate electrode DRG of the driving transistor DT, a second electrode of the first transistor T1 and a first capacitor electrode of the storage capacitor Cst. A third node N3 is a connection node of a first electrode of the driving transistor DT, a first electrode of the third transistor T3 and a first electrode of the sixth transistor T6.

An (n−1)th gate signal Scan(n−1) is applied to a gate electrode of the first transistor T1, and an initialization signal Vini is applied to a first electrode of the first transistor T1. A second electrode of the first transistor T1 is connected to a first capacitor electrode of the storage capacitor Cst, a second electrode of the third transistor T3 and the gate electrode DRG of the driving transistor DT.

The first transistor T1 is turned on according to a low logic level of the (n−1)th gate signal Scan(n−1) supplied through an (n−1)th gate line. When the first transistor T1 is turned on, the second node N2 as the gate electrode DRG of the driving transistor DT is initialized with the initialization signal Vini.

An (n)th gate signal Scan(n) is applied to a gate electrode of the second transistor T2, and the initialization signal Vini is applied to a second electrode of the second transistor T2. A first electrode of the second transistor T2 is connected to an anode of the light emitting diode Del. The second transistor T2 is turned on according to a low logic level of the (n)th gate signal Scan(n) supplied through an (n)th gate line. When the second transistor T2 is turned on, the anode of the light emitting diode Del is initialized with the initialization signal Vini.

The (n)th gate signal Scan(n) is applied to a gate electrode of the third transistor T3. A first electrode of the third transistor T3 is connected to the first electrode of the driving transistor DT and a second electrode of the third transistor T3 is connected to the gate electrode DRG of the driving transistor DT. The third transistor T3 is turned on according to a low logic level of the (n)th gate signal Scan(n) supplied through the (n)th gate line. When the third transistor T3 is turned on, the driving transistor DT has a diode connection state.

The (n)th gate signal Scan(n) is applied to a gate electrode of the fourth transistor T4, and the data signal Vdata is applied to a second electrode of the fourth transistor T4. A first electrode of the fourth transistor T4 is connected to the second electrode of the fifth transistor T5 and the second electrode of the driving transistor DT. The fourth transistor T4 is turned on according to a low logic level of the (n)th gate signal Scan(n) supplied through the (n)th gate line. When the fourth transistor T4 is turned on, the data signal Vdata of the data line DL is charged in the first electrode of the fourth transistor T4 (or between the fourth and fifth transistors T4 and T5).

An (n)th emission signal Em(n) is applied to a gate electrode of the fifth transistor T5, and the high level voltage Vdd is applied to a first electrode of the fifth transistor T5. The first electrode of the fifth transistor T5 is connected to a first electrode of the seventh transistor T7, and a second electrode of the fifth transistor T5 is connected to the first electrode of the fourth transistor T4. The fifth transistor T5 is turned on according to a low logic level of the (n)th emission signal Em(n) supplied through an (n)th emission line. When the fifth transistor T5 is turned on, the data signal Vdata charged in the first electrode of the fourth transistor T4 is transmitted to a second capacitor electrode of the storage capacitor Cst through the seventh transistor T7.

The (n)th emission signal Em(n) is applied to a gate electrode of the sixth transistor T6. A first electrode of the sixth transistor T6 is connected to the first electrode of the driving transistor DT, and a second electrode of the sixth transistor T6 is connected to the anode of the light emitting diode Del. The sixth transistor T6 is turned on according to a low logic level of the (n)th emission signal Em(n) supplied through the (n)th emission line. When the sixth transistor T6 is turned on, the light emitting diode Del emits light corresponding to a driving current generated by the driving transistor DT.

The (n)th emission signal Em(n) is applied to a gate electrode of the seventh transistor T7, and the high level voltage Vdd is applied to a first electrode of the seventh transistor T7. The first electrode of the seventh transistor T7 is connected to the first electrode of the fifth transistor T5, and a second electrode of the seventh transistor T7 is connected to the second capacitor electrode of the storage capacitor Cst. The seventh transistor T7 is turned on according to a low logic level of the (n)th emission signal Em(n) supplied through the (n)th emission line. When the seventh transistor T7 is turned on, the data signal Vdata in the first electrode of the fourth transistor T4 is transmitted to the second capacitor electrode of the storage capacitor Cst through the fifth transistor T5.

The first capacitor electrode of the storage capacitor Cst is connected to the second electrode of the first transistor T1, and the second capacitor electrode of the storage capacitor Cst is connected to the second electrode of the seventh transistor T7. A connection node of the second electrode of the seventh transistor T7 and the second capacitor electrode of the storage capacitor Cst is defined as a voltage delivery node VDN where the reference signal Vref is transmitted.

The anode of the light emitting diode Del is connected to the second electrode of the sixth transistor T6, and the low level voltage Vss is applied to a cathode of the light emitting diode Del.

The reference voltage compensating part STRC includes the first and second compensating transistors TC1 and TC2.

The first compensating transistor TC1 has a gate electrode receiving the (n−1)th gate signal Scan(n−1), a first electrode connected to a compensation node STR and a second electrode receiving the reference signal Vref. The first compensating transistor TC1 applies the reference signal Vref to the compensation node STR according to the (n−1)th gate signal Scan(n−1).

The second compensating transistor TC2 has a gate electrode receiving the (n)th gate signal Scan(n), a first electrode connected to the compensation node STR and a second electrode receiving the reference signal Vref. The second compensating transistor TC2 applies the reference signal Vref to the compensation node STR according to the (n)th gate signal Scan(n).

The driving transistor DT is a four-terminal transistor. A gate electrode DRG of the driving transistor DT is connected to the second electrode of the first transistor T1, the first capacitor electrode of the storage capacitor Cst and the second electrode of the third transistor T3. A first electrode of the driving transistor DT is connected to the first electrode of the third transistor T3 and the first electrode of the sixth transistor T6. A second electrode of the driving transistor DT is connected to the first electrode of the fourth transistor T4. A bottom shielding metal BSM of a third electrode of the driving transistor DT is connected to the first node N1. The first node N1 may be disposed in a first connection portion CP1 (see FIG. 5) of the bottom shielding metal BSM and the second capacitor electrode.

The first connection portion CP1 is disposed in a circuit line area CA (see FIG. 5) having an initialization line for the initialization signal Vini and a reference line for the reference signal Vref other than the subpixel SP defined by the gate line GL and the data line DL. A second connection portion CP2 (see FIG. 5) of the anode of the light emitting diode Del is disposed in the subpixel SP.

In FIG. 4, the subpixel SP of the electroluminescence display device operates in an initialization period INI, a sampling period SAM, a holding period HLD and an emission period EMI. During the initialization period INI, the gate electrode DRG of the driving transistor DT is initialized. During the sampling period SAM, a threshold voltage of the driving transistor DT is detected and the light emitting diode Del is initialized. During the holding period HLD, the data signal Vdata applied through the data line is kept in the nodes. During the emission period EMI, the light emitting diode Del emits light corresponding to the driving current generated by the driving transistor DT.

During the initialization period INI and the sampling period SAM, the (n)th emission signal Em(n) is not applied (a high logic level of the (n)th emission signal Em(n) is applied) to the subpixel, and an inner compensation is performed in the electroluminescence display device. Each of the (n−1)th gate signal Scan(n−1) and the (n)th gate signal Scan(n) has the low logic level of one horizontal time (1H). Further, each of the initialization period INI and the sampling period SAM has one horizontal time (1H).

During the initialization period INI, the first transistor T1 is turned on according to the low logic level of the (n−1)th gate signal Scan(n−1) applied through the (n−1)th gate line. The initialization signal Vini applied through the initialization line has a lower voltage than the high level voltage Vdd applied through the first power line EVDD. As a result, the gate electrode DRG of the driving transistor DT is initialized with the initialization signal Vini.

During the sampling period SAM, the second transistor T2, the third transistor T3 and the fourth transistor T4 are turned on according to the low logic level of the (n)th gate signal Scan(n) applied through the (n)th gate line. The light emitting diode Del is initialized with the initialization signal Vini due to the turn-on operation of the second transistor T2. The driving transistor DT has a diode connection state due to the turn-on operation of the third transistor T3. The threshold voltage of the driving transistor DT is sampled (detected) due to the turn-on operation of the third transistor T3. In addition, the voltage applied to the first electrode of the driving transistor DT is charged to the gate electrode DRG through the third transistor T3 such that the gate electrode DRG has a sum (Vdd+Vth) of the high level voltage Vdd and the threshold voltage Vth. The data signal (i.e., data voltage) Vdata applied through the data line is applied to the second electrode DRS of the driving transistor DT due to the turn-on operation of the fourth transistor T4.

During the initialization period INI and the sampling period SAM, the reference signal Vref is applied to the compensation node STR to reflect a voltage drop of the high level voltage Vdd.

Figure 5:
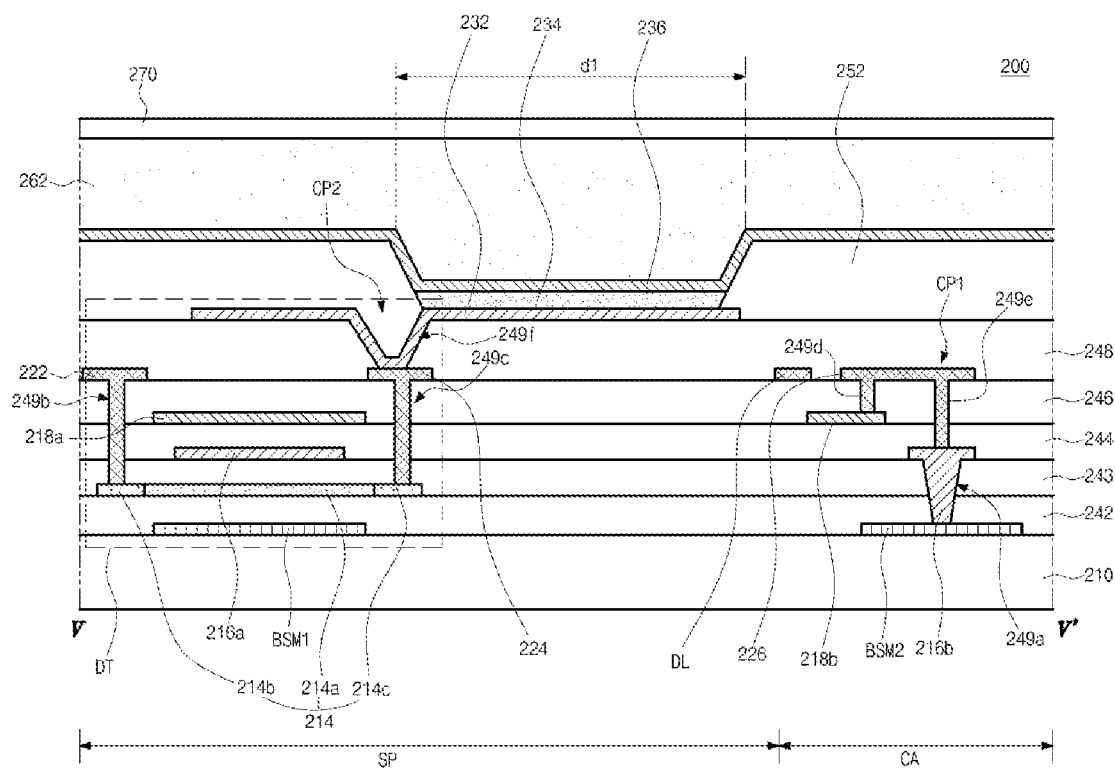
FIG. 5 is a cross-sectional view taken along a line V-V' of FIG. 3B.

FIG. 5 is a cross-sectional view taken along a line V-V' of FIG. 3B.

In FIG. 5, the electroluminescence display device 200 according to an embodiment of the present disclosure includes first and second substrates 210 and 270, the driving transistor DT and the light emitting diode Del. The first substrate 210 includes the subpixel SP displaying an image using the driving transistor DT and the light emitting diode Del and the circuit line area CA having the initialization line and the reference line. Although only the driving transistor DT is disposed on the first substrate 210 in FIG. 5, the first to seventh transistors T1 to T7 and the first and second compensating transistors TC1 and TC2 are disposed on the first substrate 210.

First and second bottom shielding metal portions BSM1 and BSM2 are disposed in the subpixel SP and the circuit line area CA, respectively, on the first substrate 210. The first substrate 210 may include a transparent glass or a flexible plastic, and the first and second bottom shielding metal portions BSM1 and BSM2 may include a metal. However, a material for the first substrate 210 and the first and second bottom shielding metal portions BSM1 and BSM2 is not limited thereto.

The first and second bottom shielding metal portions BSM1 and BSM2 minimize a back channel phenomenon due to charges trapped in the first substrate 210 to prevent a residual image or deterioration of a transistor. While the electroluminescence display device 200 operates, potentials of the first and second bottom shielding metal portions BSM1 and BSM2 may be changed to influence the threshold voltage of the driving transistor DT. When the first and second bottom shielding metal portions BSM1 and BSM2 have a floating state, the threshold voltage of the driving transistor DT may have various shift magnitudes to cause deterioration such as a luminance change. As a result, the first and second bottom shielding metal portions BSM1 and BSM2 are electrically connected to one of electrodes of the electroluminescence display device 200. For example, the first and second bottom shielding metal portions BSM1 and BSM2 may be connected to a capacitor electrode of the storage capacitor Cst.

Although the first bottom shielding metal portion BSM1 of the subpixel SP and the second bottom shielding metal portion BSM2 of the circuit line area CA are shown to be divided in FIG. 5, the first bottom shielding metal portion BSM1 of the subpixel SP and the second bottom shielding metal portion BSM2 of the circuit line area CA are connected to each other in a plan view to constitute the bottom shielding metal BSM of one body.

A buffer layer 242 is disposed on the first and second bottom shielding metal portions BSM1 and BSM2 and the first substrate 210. A semiconductor layer 214 is disposed in the subpixel SP on the buffer layer 242, and a gate insulating layer 243 is disposed on the semiconductor layer 214 and the buffer layer 242.

The semiconductor layer 214 may include an oxide semiconductor material such as indium gallium zinc oxide (IGZO). Alternatively, the semiconductor layer 214 may include amorphous silicon or polycrystalline silicon. The semiconductor layer 214 has a channel region 214a of intrinsic semiconductor material and a source region 214b and a drain region 214c of an impurity doped semiconductor material at both sides of the channel region 214a.

The gate insulating layer 243 may have a single layer or a double layer of an inorganic insulating material such as silicon oxide (SiOx) or silicon nitride (SiNx).

A gate electrode 216a and a first connecting electrode 216b are disposed in the subpixel SP and the circuit line area CA, respectively, on the gate insulating layer 243, and a interlayer insulating layer 244 is disposed on the gate electrode 216a and the first connecting electrode 216b and the gate insulating layer 243. The gate electrode 216a and the first connecting electrode 216b may be formed of the same material in a same layer through the same fabrication process. Alternatively, the gate electrode 216a and the first connecting electrode 216b may be formed of the different material in a same layer through the different fabrication process.

Although the gate electrode 216a and the first connecting electrode 216b may be formed of a metallic material such as chromium (Cr), molybdenum (Mo), tantalum (Ta), copper (Cu), titanium (Ti), aluminum (Al) and aluminum alloy, the metallic material is not limited thereto.

The first connecting electrode 216b is electrically connected to the second bottom shielding metal portion BSM2 in the circuit line area CA through the first contact hole 249a in the buffer layer 242 and the gate insulating layer 243.

First and second capacitor electrode portions 218a and 218b are disposed in the subpixel SP and the circuit line area CA, respectively, on the interlayer insulating layer 244. Although the first and second capacitor electrode portions 218a and 218b are shown to be divided in FIG. 5, the first and second capacitor electrode portions 218a and 218b are connected to each other in a plan view to constitute the second capacitor electrode of the storage capacitor Cst of one body.

Although the first and second capacitor electrode portions 218a and 218b may be formed of a metallic material, it is not limited thereto.

A passivation layer 246 is disposed on the first and second capacitor electrode portions 218a and 218b and the interlayer insulating layer 244. First and second electrodes 222 and 224 are disposed in the subpixel SP on the passivation layer 246, and a second connecting electrode 226 is disposed in the circuit line area CA on the passivation layer 246. Further, a data line DL is disposed on the passivation layer 246. The second connecting electrode 226 and the first and second electrodes 222 and 224 may be formed of the same material in a same layer through the same fabrication process. Alternatively, the second connecting electrode 226 and the first and second electrodes 222 and 224 may be formed of the different material through a different fabrication process.

The passivation layer 246 may be formed of an organic material such as photoacryl or may have multiple layers of an inorganic layer and an organic layer. Although the first and second electrodes 222 and 224 and the second connecting electrode 226 may be formed of a metallic material such as chromium (Cr), molybdenum (Mo), tantalum (Ta), copper (Cu), titanium (Ti), aluminum (Al) and aluminum alloy, the metallic material is not limited thereto.

The first and second electrodes 222 and 224 are electrically connected to the source region 214b and the drain region 214c, respectively, through second and third contact holes 249b and 249c in the gate insulating layer 243, the interlayer insulating layer 244 and the passivation layer 246. The second connecting electrode 226 is electrically connected to the second capacitor electrode portion 218b through a fourth contact hole 249d in the passivation layer 246 and is electrically connected to the first connecting electrode 216b through a fifth contact hole 249e in the interlayer insulating layer 244 and the passivation layer 246.

The second capacitor electrode portion 218b and the second bottom shielding metal portion BSM2 in the circuit line area CA are electrically connected to each other through the first and second connecting electrodes 216b and 226. The second capacitor electrode portion 218b is integrated as the second capacitor electrode with the first capacitor electrode portion 218a in the subpixel SP, and the second bottom shielding metal portion BSM2 is integrated as the bottom shielding metal BSM with the first bottom shielding metal portion BSM1 in the subpixel SP. As a result, the bottom shielding metal BSM is electrically connected to the second capacitor electrode of the storage capacitor Cst through the first and second connecting electrodes 216b and 226.

The semiconductor layer 214, the gate electrode 216a, the first electrode 222 and the second electrode 224 constitute the driving transistor DT. Although the driving transistor DT has a coplanar structure in FIG. 5, the driving transistor DT may have another structure in another embodiment.

A planarizing layer 248 is disposed on the driving transistor DT. The planarizing layer 248 may be formed of an organic material such as photoacryl or may have a multiple layer of an inorganic layer and an organic layer. The planarizing layer 248 has a sixth contact hole 249f exposing the second electrode 224.

An anode 232 is disposed on the planarizing layer 248. The anode 232 is electrically connected to the second electrode 224 of the driving transistor DT through the sixth contact hole 249f. The anode 232 may have a single layered structure or a multiple layered structure including a metallic material such as calcium (Ca), barium (Ba), magnesium (Mg), aluminum (Al), silver (Ag) or alloy thereof. The anode 232 is connected to the second electrode 224 of the driving transistor DT and a signal corresponding to the data signal is applied to the anode 224.

A bank layer 252 is disposed in a border portion of the subpixel SP on the planarizing layer 248. The bank layer 252 is a sidewall dividing the subpixel SP preventing mixture of the colored lights of the adjacent subpixels SP.

An emitting layer 234 is disposed on the anode 232 and a portion of a slanted surface of the bank layer 252. The emitting layer 234 may include a red emitting layer emitting a red colored light in a red subpixel, a green emitting layer emitting a green colored light in a green subpixel and a blue emitting layer emitting a blue colored light in a blue subpixel. In addition, the emitting layer 234 may include a white emitting layer emitting a white colored light.

The emitting layer 234 may include an emitting material layer emitting light, an electron injecting layer injecting electrons from a cathode, an electron transporting layer transporting electrons to the emitting material layer, a hole injecting layer injecting holes from an anode and a hole transporting layer transporting holes to the emitting material layer.

A cathode 236 is disposed on the emitting layer 234. The cathode may include a transparent conductive material such as indium tin oxide (ITO) and indium zinc oxide (IZO) or a metallic material having a thickness where a visible ray is transmitted. However, a material for the cathode 236 is not limited thereto.

An encapsulating layer 262 is disposed on the cathode 236. The encapsulating layer 262 may have a single layered structure including an inorganic layer, a double layered structure including an inorganic layer and an organic layer, or a triple layered structure including an inorganic layer, an organic layer and an inorganic layer. Although the inorganic layer may include an inorganic material such as silicon nitride and silicon oxide, it is not limited thereto. Although the organic layer may include an organic material such as polyethylene terephthalate (PET), polyethylene naphthalate (PEN), polycarbonate (PC), polyimide (PI), polyethylene sulfonate (PES), polyoxymethylene (POM) and polyarylate (PAR) and a mixture thereof, it is not limited thereto.

A second substrate 270 is disposed on the encapsulating layer 262 and is attached to the encapsulating layer 262 with an adhesive layer (not shown). The adhesive layer may include a material having a relative high adhesion force, a relatively high heat resistance and a relatively high water resistance. For example, the adhesive layer may include a heat curable resin such as an epoxy composition, an acrylate composition and an acrylic rubber. Alternatively, the adhesive layer may include a light curable resin. When the adhesive layer includes a light curable resin, the adhesive layer may be cured by irradiating light such as an ultraviolet ray onto the adhesive layer.

The adhesive layer attaches the first and second substrates 210 and 270. Further, the adhesive layer may function as an encapsulation layer preventing penetration of a moisture into the electroluminescence display device 200.

The second substrate 270 is an encapsulation cap for encapsulating the electroluminescence display device 200. The second substrate 270 may include glass or a protecting film such as a polystyrene (PS) film, a polyethylene (PE) film, a polyethylene naphthalate (PEN) film and a polyimide (PI) film.

In the electroluminescence display device 200 according to an embodiment of the present disclosure, since the bottom shielding metal BSM of the driving transistor DT is connected to the second capacitor electrode of the storage capacitor Cst, a variation of the threshold voltage of the driving transistor DT due to a floating state of the bottom shielding metal BSM is prevented.

Further, since the first connection portion CP1 of the bottom shielding metal BSM is disposed in the circuit line area CA other than the subpixel SP, the emission region of the subpixel is enlarged.

Figure 6:
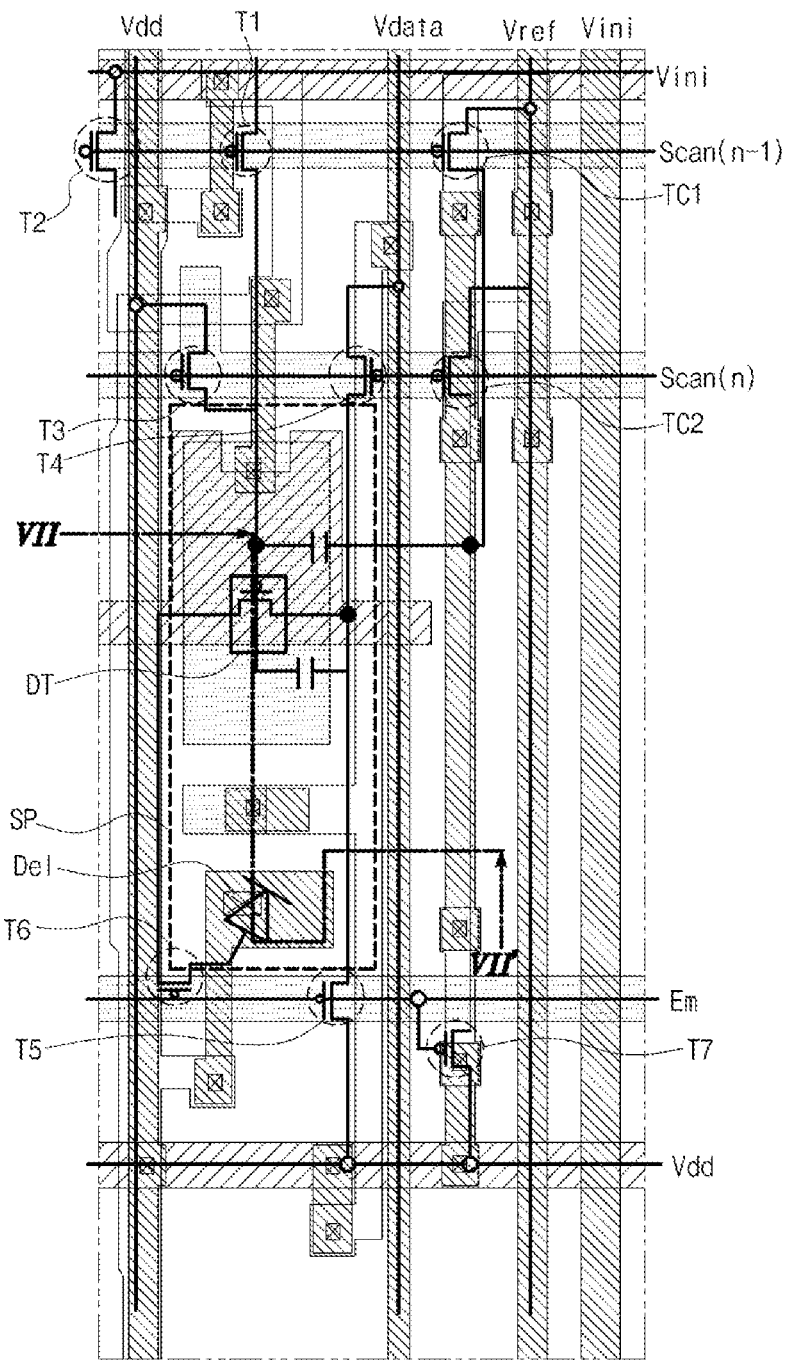
FIG. 6 is a plan view showing a subpixel of an electroluminescence display device according to a comparison example.
Figure 7:
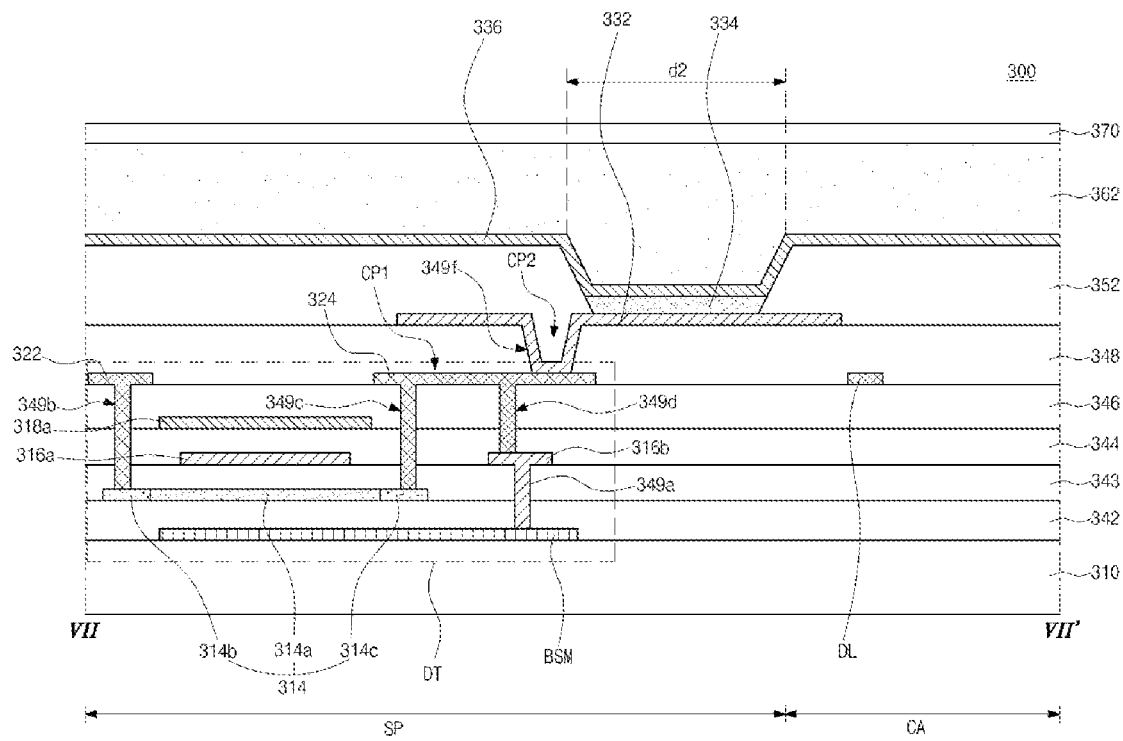
FIG. 7 is a cross-sectional view taken along a line VII-VII' of FIG. 6.

FIG. 6 is a plan view showing a subpixel of an electroluminescence display device according to a comparison example, and FIG. 7 is a cross-sectional view taken along a line VII-VII' of FIG. 6. Illustration on a structure of the comparison example the same as a structure of an embodiment of the present disclosure will be omitted.

In FIG. 6, an electroluminescence display device according to a comparison example includes a driving transistor DT and a light emitting diode Del. A bottom shielding metal BSM of the driving transistor DT is connected to a second electrode 324 of the driving transistor DT, and a first connection portion CP1 of the bottom shielding metal BSM and the second electrode 324 is disposed in a subpixel SP. A second connection portion CP2 of the driving transistor DT and the light emitting diode Del is disposed in the subpixel SP. The second connection portion CP2 may be disposed in a lower portion of the subpixel SP in a plan view as compared with the first connection portion CP1.

In FIG. 7, the electroluminescence display device 300 according to a comparison example includes first and second substrates 310 and 370, the driving transistor DT and the light emitting diode Del. The first substrate 310 includes the subpixel SP displaying an image using the driving transistor DT and the light emitting diode Del and the circuit line area CA having the initialization line and the reference line. The bottom shielding metal BSM is disposed in the subpixel SP on a first substrate 310, and a buffer layer 342 is disposed on the bottom shielding metal BSM and the first substrate 310. A semiconductor layer 314 is disposed in the subpixel SP on the buffer layer 342, and a gate insulating layer 343 is disposed on the semiconductor layer 314 and the buffer layer 342.

A gate electrode 316a and a connecting electrode 316b are disposed in the subpixel SP on the gate insulating layer 343, and an interlayer insulating layer 344 is disposed on the gate electrode 316a and the connecting electrode 316b and the gate insulating layer 343.

The connecting electrode 316b is electrically connected to the bottom shielding metal BSM through a first contact hole 349a in the buffer layer 342 and the gate insulating layer 343.

A first capacitor electrode portion 318 is disposed in the subpixel SP on the interlayer insulating layer 344. The first capacitor electrode portion 318a constitutes the second capacitor electrode of the storage capacitor Cst.

A passivation layer 346 is disposed on the first capacitor electrode portion 318a and the interlayer insulating layer 344. First and second electrodes 322 and 324 are disposed in the subpixel SP on the passivation layer 346. Further, a data line DL is disposed on the passivation layer 346.

The first and second electrodes 322 and 324 are electrically connected to a source region 314b and a drain region 314c, respectively, through second and third contact holes 349b and 349c in the gate insulating layer 343, the interlayer insulating layer 344 and the passivation layer 346. Further, the second electrode 324 is electrically connected to the connecting electrode 316b through a fourth contact hole 349d in the passivation layer 346. In the electroluminescence display device 300 according to a comparison example, the second electrode 324 of the driving transistor DT is electrically connected to the bottom shielding metal BSM in the subpixel SP.

A planarizing layer 348 is disposed on the driving transistor DT, and an anode 332 is disposed on the planarizing layer 348. The anode 332 is electrically connected to the second electrode 324 of the driving transistor DT through a sixth contact hole 349f. A bank layer 352 is disposed in a border portion of the subpixel SP on the planarizing layer 348.

An emitting layer 334 is disposed on the anode 332 and a portion of a slanted surface of the bank layer 352, and a cathode 336 is disposed on the emitting layer 334.

An encapsulating layer 362 is disposed on the cathode 336, and a second substrate 370 is disposed on the encapsulating layer 362 to be attached to the encapsulating layer 362 with an adhesive layer (not shown).

In the electroluminescence display device 300 according to a comparison example, the first connecting portion CP1 of the bottom shielding metal BSM and the second electrode 324 of the driving transistor DT and the second connecting portion CP2 of the anode 332 of the light emitting diode Del and the second electrode 324 of the driving transistor DT are disposed in the subpixel SP. Specifically, the second connecting portion CP2 is disposed in a lower portion of the subpixel SP in a plan view as compared with the first connecting portion CP1.

In the electroluminescence display device 200 according to an embodiment of the present disclosure, a degree of freedom in disposition of the second connecting portion CP2 increases in the subpixel SP as compared with the electroluminescence display device 300 according to a comparison example.

In the electroluminescence display device 200 according to an embodiment of the present disclosure of FIG. 5, since the first connecting portion CP1 is disposed in the circuit line area CA and the second connecting portion CP2 is disposed in the subpixel SP, the emission region has a first width d1.

In the electroluminescence display device 300 according to a comparison example of FIG. 7, since the first connecting portion CP1 and the second connecting portion CP2 are disposed in the subpixel SP, the emission region has a second width d2 smaller than the first width d1. (d1>d2)

As the first width d1 of the emission region of FIG. 5 increases as compared with the second width d2 of the emission region of FIG. 7, the electroluminescence display device 200 according to an embodiment of the present disclosure has the following advantages as compared with of the electroluminescence display device 300 according to a comparison example.

First, as an area of the emission region increases, a design margin of the anode is obtained and interference between the adjacent subpixels is prevented.

In the electroluminescence display device 200 according to an embodiment of the present disclosure, the red, green and blue light emitting diodes of the red, green and blue subpixels emit the red, green and blue colored lights, respectively, and have different emission efficiencies. As a result, for the white colored light by mixture of the red, green and blue colored lights, the red, green and blue emission regions of the red, green and blue subpixels have different areas.

The area of the green emission region may be smaller than the area of the red emission region and may be greater than the area of the blue emission region. The areas of the red, green and blue emission regions may vary according to a structure and a material.

In the electroluminescence display device 300 according to a comparison example, the emission region of the subpixel SP has a relatively small area. As a result, a sufficient design margin for the blue emitting layer or the green emitting layer having a relatively great area is not obtained due to the relatively small emission region of the subpixel SP, and the emitting layer may be deteriorated.

In addition, the blue emitting layer or the green emitting layer may be disposed over an interference limit line of the subpixel SP such that a display quality is deteriorated due to an optical interference between the adjacent subpixels SP.

In the electroluminescence display device 200 according to an embodiment of the present disclosure, since the emission region of the subpixel SP is enlarged, a sufficient design margin of the emitting layer is obtained and the emitting layer is prevented from being disposed over an interference limit line of the subpixel SP. As a result, deterioration of the display quality due to an optical interference is prevented.

Second, in the electroluminescence display device 300 according to a comparison example, since the first connecting portion CP1 is disposed in the subpixel SP, a sufficient space for the first capacitor electrode portion 318a is not obtained and an area of the first capacitor electrode portion 318a decreases. As a result, a sufficient capacitance of the storage capacitor Cst is not obtained.

In the electroluminescence display device 200 according to an embodiment of the present disclosure, the first connecting portion CP1 is not disposed in the subpixel SP, a sufficient space for the first capacitor electrode portion 218a is obtained and the first capacitor electrode portion 218a is formed to have a predetermined area. As a result, a sufficient capacitance of the storage capacitor Cst is obtained.

Third, utilization of a voltage in the data driving part 130 of the electroluminescence display device 200 according to an embodiment of the present disclosure is improved as compared with the electroluminescence display device 300 according to a comparison example.

Figure 8A:
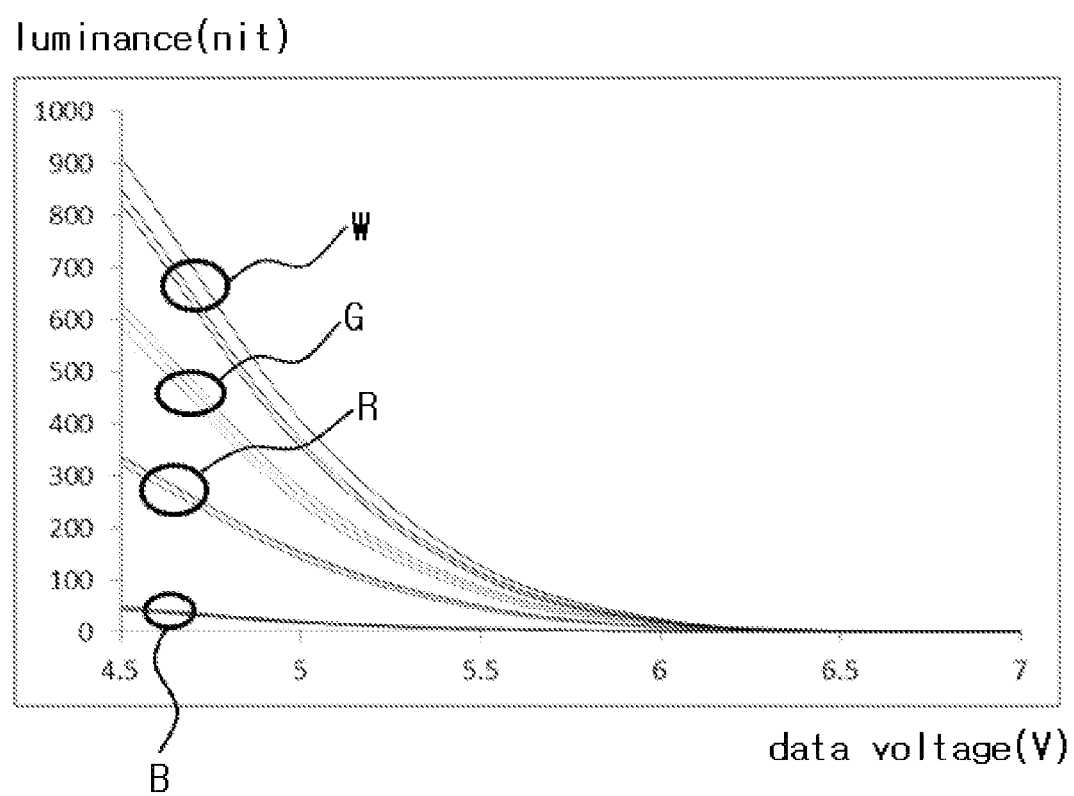
FIG. 8A is a graph showing a data voltage applied to a bottom shielding metal and a luminance of an electroluminescence display device according to a comparison example.
Figure 8B:
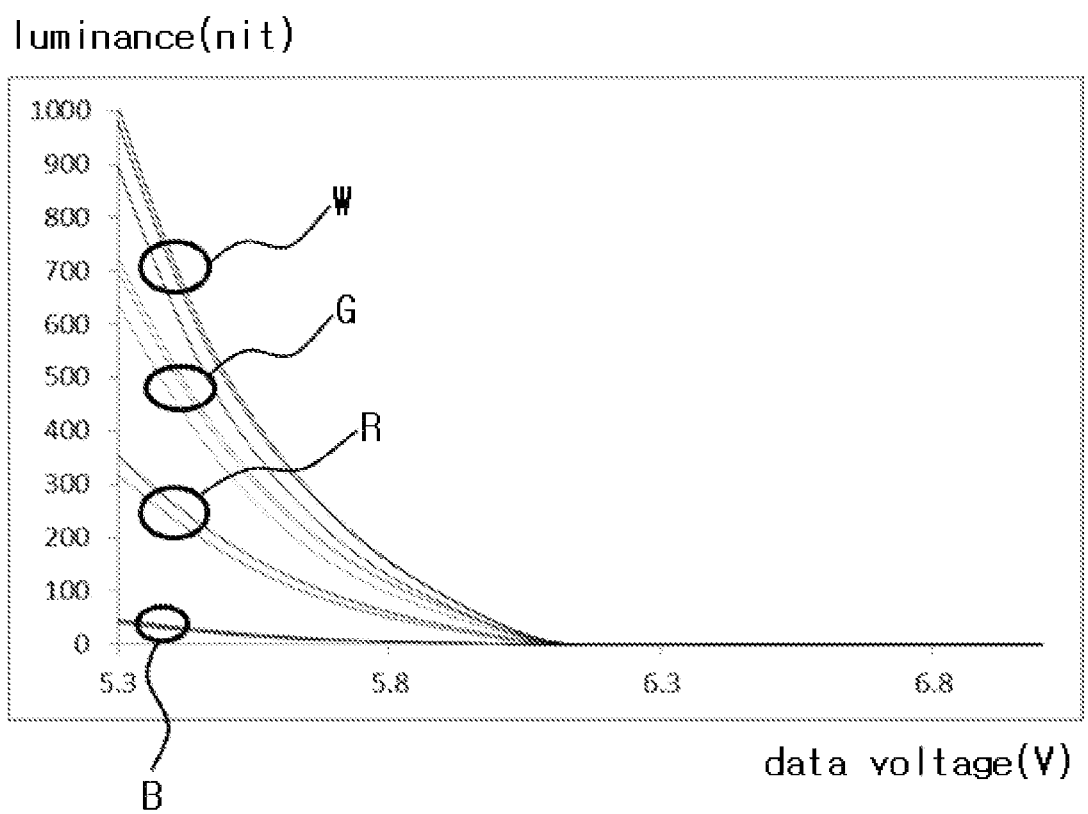
FIG. 8B is a graph showing a data voltage applied to a bottom shielding metal and a luminance of an electroluminescence display device according to an embodiment of the present disclosure.

FIG. 8A is a graph showing a data voltage applied to a bottom shielding metal and luminance of an electroluminescence display device according to a comparison example, and FIG. 8B is a graph showing a data voltage applied to a bottom shielding metal and luminance of an electroluminescence display device according to an embodiment of the present disclosure.

In the electroluminescence display device 300 according to a comparison example of FIG. 8A, luminance of about 0 nit to about 800 nit for blue colored light B, red colored light R, green colored light G and white colored light W is obtained by applying a data voltage (a data signal) Vdata of about 4.5V to about 6.2V to the bottom shielding metal BSM.

In the electroluminescence display device 200 according to an embodiment of the present disclosure of FIG. 8B, luminance of about 0 nit to about 800 nit for blue colored light B, red colored light R, green colored light G and white colored light W is obtained by applying a data voltage (a data signal) Vdata of about 5.3V to about 6.1V to the bottom shielding metal BSM.

The electroluminescence display device 200 according to an embodiment of the present disclosure displays an image of the luminance of about 0 nit to about 800 nit using a data voltage range of about 0.8V, while the electroluminescence display device 300 according to a comparison example displays an image of the luminance of about 0 nit to about 800 nit using a data voltage range of about 1.7V.

For example, when the data voltage Vdata outputted from the data driving part 130 is fixed to about 5V, the electroluminescence display device 200 according to an embodiment of the present disclosure may have higher luminance as compared with the electroluminescence display device 300 according to a comparison example.

Consequently, in the electroluminescence display device 200 according to an embodiment of the present disclosure, since the bottom shielding metal BSM is connected to the capacitor electrode of the storage capacitor Cst in the circuit line area CA other than the subpixel SP, the area of the emission region in the subpixel SP is enlarged.

In addition, since the degree of freedom in disposition of the second connecting portion CP2 increases according to increase of the emission region disposition, the design margin of the emitting layer increases and the interference between the adjacent subpixels is prevented. As a result, the area of the capacitor electrode is enlarged and a sufficient capacitance of the storage capacitor Cst is obtained.

Further, since utilization of the data voltage range in the data driving part is improved, the image of higher luminance is displayed with respect to the data voltage applied to the bottom shielding metal BSM.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:
1. A display device comprising:
 a substrate having a subpixel and a circuit line area adjacent to the subpixel;
 a driving transistor in the subpixel;

a first bottom shielding metal portion under the driving transistor in the subpixel and a second bottom shielding metal portion in the circuit line area;
a first capacitor electrode portion in the subpixel and a second capacitor electrode portion in the circuit line area; and
a light emitting diode in the subpixel,
wherein the second bottom shielding metal portion is electrically connected to the second capacitor electrode portion in the circuit line area.

2. The display device of claim 1, wherein the driving transistor comprises:
a semiconductor layer on the substrate;
a gate insulating layer on the semiconductor layer;
a gate electrode on the gate insulating layer;
an interlayer insulating layer on the gate electrode;
a passivation layer on the first capacitor electrode portion; and
first and second electrodes on the passivation layer.

3. The display device of claim 2, further comprising first and second connecting electrodes in the circuit line area and electrically connecting the second bottom shielding metal portion with the second capacitor electrode portion.

4. The display device of claim 3, wherein the first connecting electrode is electrically connected to the second bottom shielding metal portion through a first contact hole in the gate insulating layer, and
wherein the second connecting electrode is electrically connected to the first connecting electrode through a second contact hole in the gate insulating layer and the interlayer insulating layer and is electrically connected to the second capacitor electrode portion through a third contact hole in the passivation layer.

5. The display device of claim 4, wherein the first connecting electrode is disposed in a same layer through a same process as the gate electrode.

6. The display device of claim 4, wherein the second connecting electrode is disposed in a same layer through a same process as the first and second electrodes.

7. The display device of claim 1, wherein the first bottom shielding metal portion and the second bottom shielding metal portion are connected to each other as one body.

8. The display device of claim 1, wherein the first capacitor electrode portion and the second capacitor electrode portion are connected to each other as one body.

9. The display device of claim 1, wherein the light emitting diode comprises:
an anode;
an emitting layer on the anode; and
a cathode on the emitting layer.

10. The display device of claim 9, wherein the anode is electrically connected to the driving transistor in the subpixel.

11. The display device of claim 1, wherein the first capacitor electrode portion and the second capacitor electrode portion constitute a second capacitor electrode of a storage capacitor, and a first capacitor electrode of the storage capacitor is connected to a gate electrode of the driving transistor.

12. The display device of claim 1, wherein a first connection portion between the second bottom shielding metal portion and the second capacitor electrode portion is disposed in the circuit line area, and a second connection portion between the driving transistor and an anode of the light emitting diode is disposed in the subpixel.

13. The display device of claim 1, further comprising a planarization layer on the driving transistor and a bank layer in a border portion of the subpixel on the planarizing layer, wherein an emitting layer of the light emitting diode is disposed on an anode of the light emitting diode and a portion of a slanted surface of the bank layer.

14. A display device, comprising:
a subpixel and a circuit line area adjacent to the subpixel;
a driving transistor in the subpixel;
a bottom shielding metal in the subpixel and the circuit line area; and
a capacitor electrode in the subpixel and the circuit line area,
wherein the bottom shielding metal is electrically connected to the capacitor electrode in the circuit line area,
wherein the bottom shielding metal is disposed under the driving transistor, and
wherein the circuit line area has a data line for a data signal supplied to the subpixel, an initialization line for an initialization signal supplied to the subpixel and a reference line for a reference signal supplied to the subpixel,
wherein the bottom shielding metal and the capacitor electrode are connected to each other through first and second connecting electrodes, and
wherein the first and second connecting electrodes are disposed between two of the data line, the initialization line, and the reference line.

15. The display device of claim 14, further comprising a light emitting diode in the subpixel and emitting a light.

16. The display device of claim 15, wherein an anode of the light emitting diode is electrically connected to the driving transistor in the subpixel.

17. The display device of claim 14, wherein the capacitor electrode is a second capacitor electrode of a storage capacitor, and a first capacitor electrode of the storage capacitor is electrically connected to a gate electrode of the driving transistor.

18. The display device of claim 15, wherein a first connection portion between the bottom shielding metal and the capacitor electrode is disposed in the circuit line area, and a second connection portion between the driving transistor and an anode of the light emitting diode is disposed in the subpixel.

19. The display device of claim 15, further comprising a planarization layer on the driving transistor and a bank layer in a border portion of the subpixel on the planarizing layer, wherein an emitting layer of the light emitting diode is disposed on an anode of the light emitting diode and a portion of a slanted surface of the bank layer.

20. The display device of claim 14, wherein the capacitor electrode overlaps a gate electrode of the driving transistor.

* * * * *